United States Patent
Baba

(10) Patent No.: US 6,941,413 B2
(45) Date of Patent: Sep. 6, 2005

(54) NONVOLATILE MEMORY, ITS DATA UPDATING METHOD, AND CARD READER EQUIPPED WITH SUCH NONVOLATILE MEMORY

(75) Inventor: Tsutomu Baba, Nagano (JP)

(73) Assignee: Sankyo Seiki Mfg. Co., Ltd., Nagano (JP)

(*) Notice: Subject to any disclaimer, the term of this patent is extended or adjusted under 35 U.S.C. 154(b) by 288 days.

(21) Appl. No.: 10/331,100

(22) Filed: Dec. 26, 2002

(65) Prior Publication Data

US 2003/0145160 A1 Jul. 31, 2003

(30) Foreign Application Priority Data

Dec. 28, 2001 (JP) ........................ 2001-400015

(51) Int. Cl.⁷ ............................................. G06F 12/00
(52) U.S. Cl. ................. 711/104; 711/103; 711/154; 711/156; 711/162; 711/165
(58) Field of Search ................... 711/104, 103, 711/154, 156, 162, 165

(56) References Cited

U.S. PATENT DOCUMENTS

| | | | | |
|---|---|---|---|---|
| 5,754,817 A | * | 5/1998 | Wells et al. ................. | 711/203 |
| 6,145,051 A | * | 11/2000 | Estakhri et al. ............. | 711/103 |
| 6,510,499 B1 | * | 1/2003 | Aaker ......................... | 711/154 |
| 6,578,127 B1 | * | 6/2003 | Sinclair ....................... | 711/202 |
| 6,622,199 B1 | * | 9/2003 | Spall et al. .................. | 711/103 |
| 6,636,951 B1 | * | 10/2003 | Tachikawa ................... | 711/154 |
| 6,725,321 B1 | * | 4/2004 | Sinclair et al. .............. | 711/103 |
| 6,813,678 B1 | * | 11/2004 | Sinclair et al. .............. | 711/103 |

FOREIGN PATENT DOCUMENTS

| | | | | |
|---|---|---|---|---|
| JP | 62-034262 | 2/1987 | ........... | G06F/12/16 |
| JP | 07-168769 | 7/1995 | ........... | G06F/12/16 |
| JP | 10-124403 | 5/1998 | ........... | G06F/12/16 |

OTHER PUBLICATIONS

Kim et al., "A New Flash Memory Mangement for Flash Storage System," pp 284–289, IEEE, Oct. 1999.*

* cited by examiner

Primary Examiner—Stephen C. Elmore
(74) Attorney, Agent, or Firm—Hogan & Hartson, LLP

(57) ABSTRACT

A method for updating data in a nonvolatile memory is provided. The method comprises the steps of writing in a RAM data stored in a data writing region of the non-volatile memory, updating the data in the RAM, updating a data error detection region in the RAM based on the data updated, writing in data saving region of the non-volatile memory the data updated in the RAM, updating an end flag region of the data saving region, deleting the data from the data writing region, writing in the data writing region the data in the RAM, updating an end flag region of the data writing region, and deleting the data from the data saving region.

24 Claims, 2 Drawing Sheets

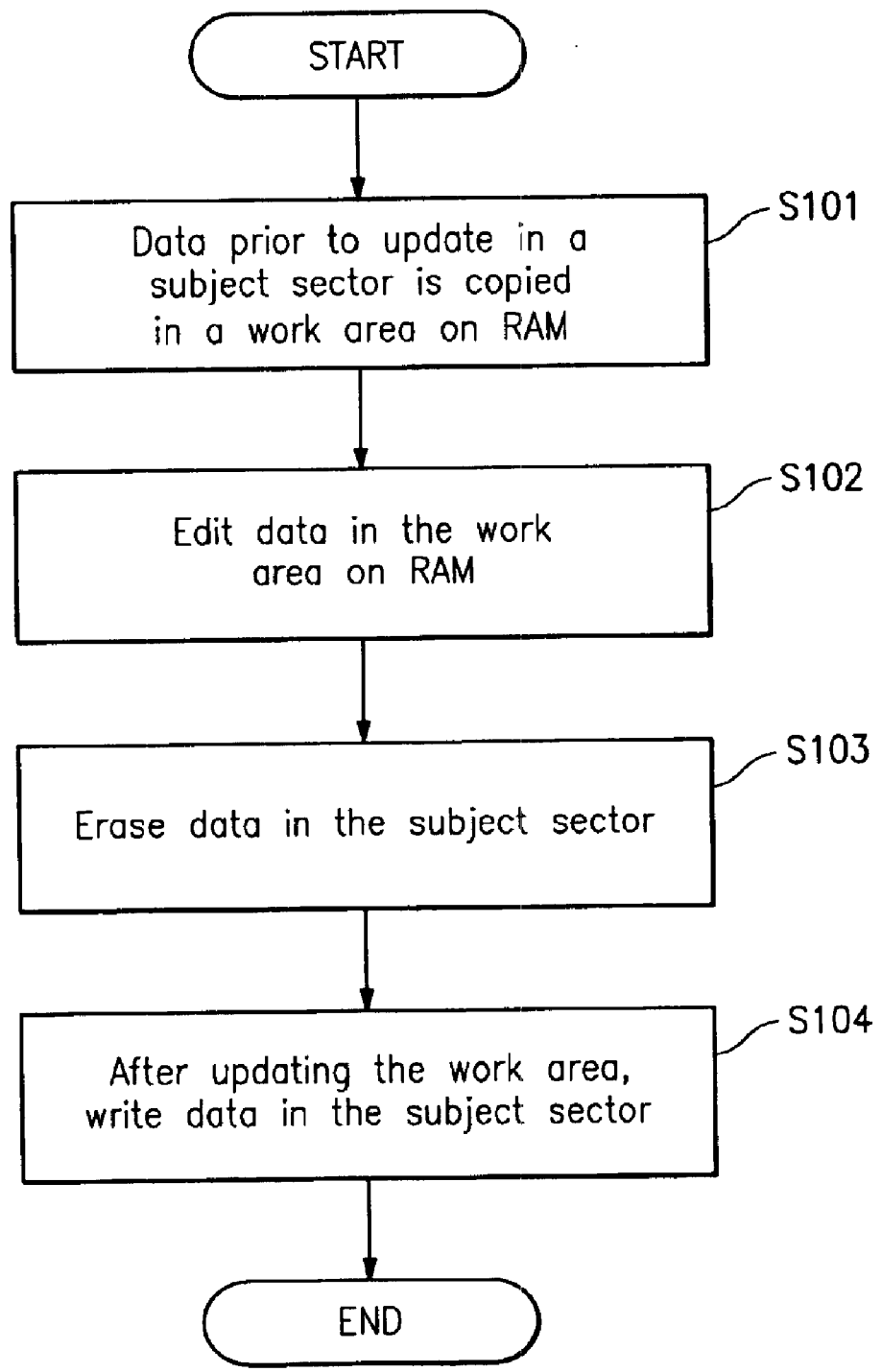

NONVOLATILE MEMORY, ITS DATA UPDATING METHOD, AND CARD READER EQUIPPED WITH SUCH NONVOLATILE MEMORY

BACKGROUND OF THE INVENTION

1. Field of the Invention

The present invention relates to nonvolatile memory, its data updating method, and a card reader equipped with such nonvolatile memory. More specifically, the present invention relates to nonvolatile memory that can protect data within the nonvolatile memory, its data updating method, and a card reader equipped with such nonvolatile memory.

2. Related Background Art

In recent years, memory capacity of flash memory has expanded significantly, and its endurance in terms of how many times it can be rewritten has grown enormously as well. As a result, in addition to its former primary use of storing program codes that are relatively infrequently rewritten, flash memory is also used as nonvolatile memory to store data that are extremely frequently rewritten.

With regard to updating data on flash memory, when updating bit data from "0" to "1", all data within a block that includes the data to be updated must be deleted (i.e., an operation to logically set the applicable bit data to "1") due to the properties of flash memory, and pinpointing and deleting only a part of data in a block cannot be done. Accordingly, a data updating processing of flash memory is done according to the following procedure (see FIG. 2).

First, before deleting all data within a block containing the data to be updated, a work area mapped on a volatile memory such as RAM (random access memory) is prepared and the range of data to be deleted is copied and temporarily saved there (step 101). Next, data to be updated is updated in the work area (step 102). In the meantime, data in the applicable block in the flash memory is deleted (step 103). The updated data in the work area is written in the applicable block from which data was deleted in the flash memory (step 104), and data update is completed.

Due to the fact that a delete processing for the flash memory involves deleting all data within a block, the delete processing often requires more time (e.g., in seconds) then other processing. Block sizes of flash memory vary from several dozen bytes to tens of thousands of bytes depending on the product type, and some require up to 15 seconds from the beginning to the end of the delete operation.

However, according to the data update method for flash memory described above, required data content is stored only in RAM from the time the data is deleted from the flash memory and until writing the updated data is completed; if power were to be unexpectedly interrupted during this time, not only would the control of the flash memory be interrupted, but data on RAM, which is a volatile memory, would be lost, which could cause a serious situation in which important data is irretrievably lost.

If such a situation occurs, data written in the flash memory may be corrupted next time the power is turned on, and in the worst case scenario the device that uses the flash memory, such as a card reader, may not operate normally.

In order to solve such problems, circuits to detect that the power is beginning to shut down and backup power sources to supplementally restore power when the power completely shuts down are provided on devices, but these increase the cost of applicable products, and in some cases even force the shape of the applicable products to be modified to accommodate them.

SUMMARY OF THE INVENTION

In view of the above, the present invention relates to a nonvolatile memory that can securely protect data in the nonvolatile memory, its data updating method, and a card reader equipped with such nonvolatile memory.

In accordance with an embodiment of the present invention, a nonvolatile memory comprises a data writing region to store necessary data and a data saving region to temporarily store data when rewriting data, where the data writing region and the data saving region each has an end flag region to indicate the completion of data writing, as well as a data error detection region in the respective center area.

Further, a method for updating data in a nonvolatile memory in accordance with an embodiment of the present invention comprises, when updating data in the nonvolatile memory, the steps of: writing in a RAM data stored in a data writing region of the non-volatile memory; updating the data in the RAM; updating a data error detection region in the RAM based on the date updated; writing in a data saving region of the non-volatile memory the data updated in the RAM; updating an end flag region of the data saving region; deleting the data from the data writing region; writing in the data writing region the data in the RAM; updating an end flag region of the data writing region; and deleting the data from the data saving region.

In other words, there are two storage regions within the nonvolatile memory and data remains in at least one of them at all times, so that even if data in one of the storage regions or the RAM were to be erased due to a power failure while data is being deleted from the storage region, the data still remains in the other storage region. Consequently, next time the power is turned on, the data in the other storage region can be used to operate the applicable device.

Depending on the timing of power failure, data may exist in both the data writing region and the data saving region. In such a case, the data error detection region and the end flag region of both storage regions are checked and the validity of data in each storage region is judged. If data in the data saving region is judged to be correct, that data is written in the data writing region. Alternatively, if the data in the data writing region is judged to be correct, that data remains there but the data in the data saving region is deleted. In this way, both the accuracy in discriminating data validity and shortening the judging time when the power is turned on after a power failure can be obtained.

Furthermore, a card reader according to the present invention is equipped with the nonvolatile memory. As described above, due to the fact that data remains in at least one of the two storage regions of the nonvolatile memory at all times, even if data in one of the storage regions or the RAM were to be erased because of a power failure while data is being deleted from the storage region, the data still remains in the other storage region. Consequently, even if a circuit to detect power shut down or a backup power source is not provided in the card reader or an ATM device in which the card reader is installed, the card reader can be operated by using data in the other storage region next time the power is turned on; as a result, the worst case scenario, in which important data is irretrievably lost and the card reader operates abnormally, can be avoided.

Other features and advantages of the invention will be apparent from the following detailed description, taken in conjunction with the accompanying drawings that illustrate, by way of example, various features of embodiments of the invention.

BRIEF DESCRIPTION OF THE DRAWINGS

FIG. 2 shows a flowchart of a process in a conventional method for updating data in a nonvolatile memory.

DESCRIPTION OF PREFERRED EMBODIMENTS

Figure 1:
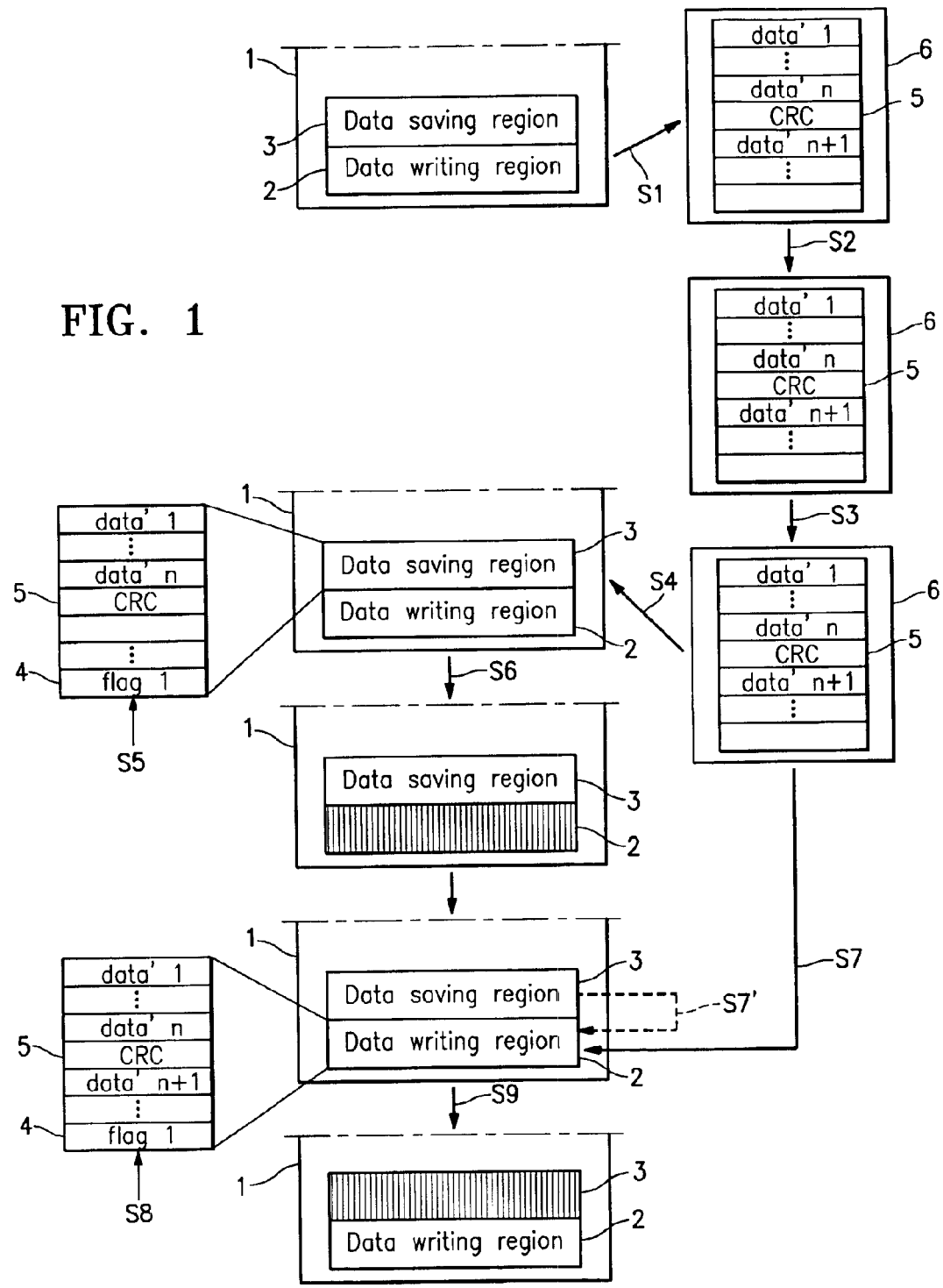
FIG. 1 conceptually shows a process in a method for updating data in a nonvolatile memory in accordance with an embodiment of the present invention.

An embodiment of the present invention will be described below with reference to the accompanying drawings.

FIG. 1 indicates a nonvolatile memory 1 in accordance with one embodiment of the present invention, and a data updating method for the nonvolatile memory 1 in accordance with an embodiment of the present invention. The nonvolatile memory 1, such as a flash memory, comprises a data writing region 2 to store necessary data and a data saving region 3 to temporarily store data when rewriting data. The data writing region 2 and the data saving region 3 each has an end flag region 4 to indicate the completion of data writing, as well as a data error detection region 5 in the respective center area. When updating data, data stored in the data writing region 2 (except the end flag region 4) is written in a RAM 6; the data is updated in the RAM 6; based on this update, the data error detection region 5 is updated in the RAM 6; the updated data in the RAM 6 is written in the data saving region 3; the end flag region 4 of the data saving region 3 is updated; the data in the data writing region 2 is deleted; the data in the RAM 6 is written in the data writing region 2; the end flag region 4 of the data writing region 2 is updated; and the data in the data saving region 3 is deleted. As a result, there are two storage regions 2 and 3 within the nonvolatile memory 1 and data remains in at least one of them at all times, so that even if data in one of the storage regions or in the RAM 6 were to be erased due to a power failure while data is being deleted from the storage region, the data still remains in the other storage region. Consequently, next time the power is turned on, the data in the other storage region can be used to operate the applicable device.

This data updating method can be described as a program, for example, where the program would be connected to the nonvolatile memory 1 and executed by a microcomputer (omitted from the drawing) that performs data reading and writing processing to and from the nonvolatile memory 1. In this way, a control device for the nonvolatile memory 1 is realized.

In the nonvolatile memory 1, BCC (block check character) in each block of the data writing region 2 and the data saving region 8 is found. Known CRC (cyclic redundancy check), for example, is used as the BCC. The CRC values are written in the data error detection region 5. According to the present embodiment, the data error detection region 5 is provided in the center of addresses in each block of the storage regions 2 and 3. In addition, the CRC values are calculated for data with addresses preceding the data error detection region 5. As a result, the data amount is one-half of what it would be if the CRC values for all data in the data writing region 2 and the data saving region 3 were calculated, thereby significantly shortening the calculation time.

In using the nonvolatile memory 1, data written in the data writing region 2 is read in normal operation. For example, when the nonvolatile memory 1 is used in a card reader, information such as magnetic head information, passing sensor voltage threshold and serial number is written in the data writing region 2, and these data are read when the card reader is used. By this time, data in the data saving region 3 is completely deleted. Deleting data from the nonvolatile memory 1 refers to setting all bits to "1."

To update data in the nonvolatile memory 1, first, data stored in the data writing region 2 (except the end flag region 4) is written in the RAM 6 (step S1). Data is updated in the RAM 6 (step S2). In this update, only those parts to be updated need be updated.

Using the updated data, the data error detection region 5 is updated in the RAM 6 (step S3). In other words, CRC values for data with addresses preceding the data error detection region 6 (data'1–data'n) are calculated, and the results are written in the data error detection region 5. Next, the updated data in the RAM 6 is written in the data saving region 3 (step s4).

The end flag region 4 of the data saving region 3 is updated (step S5). More specifically, "1" is written in the end flag region 4. Next, the data in the data writing region 2 is deleted (step S6). In other words, all bits are set to "1" by rewriting all bytes to FFh.

Next, the data in the RAM 6 is written in the data writing region 2 (step S7). Alternatively, instead of the data in the RAM 6, the data in the data saving region 3 can be used for writing (step S7').

The end flag region 4 of the data writing region 2 is updated (step S8). More specifically, "1" is written in the end flag region 4. Next, the data in the data saving region 3 is deleted (step S9). In other words, all bits are set to "1" by rewriting all bytes to FFh.

By updating data according to the procedure described, updated data, or at least pre-update data, remains in either the data writing region 2 or the data saving region 3 in a normal state even if a power failure were to occur at some point. Consequently, the applicable device would operate based on updated or pre-update data even when the device is turned on after a power failure, thereby preventing any abnormal operations.

In particular, when the nonvolatile memory 1 is mounted on a card reader, abnormal operations of the card reader can be prevented even if a circuit to detect a card reader power shut down or a backup power source is not provided in the card reader or an ATM device in which the card reader is installed.

Depending on the timing of power failure, data may remain in both the data writing region 2 and the data saving region 3. In such a case, the data error detection region 5 and the end flag region 4 of both storage regions are checked when the power is turned on to judge the validity of data in each storage region.

For example, the data error detection region 5 and the end flag region 4 of the applicable block in either the data writing region 2 or the data saving region 3 are checked when the power is turned on. If the calculated result of the CRC value for the data error detection region 5 is correct but the end flag is not "1," this is deemed to indicate that although data with addresses preceding the data error detection region 5 were written normally, as power failure occurred while writing the subsequent data and writing could not be completed. For this reason, data in the other storage region would be judged to be correct in this case.

If the end flag is "1" but the calculated result of the CRC value for the data error detection region 5 is not correct, this is deemed to indicate that a power failure occurred while data was being deleted from the applicable block and that the end flag happens to be "1" due to the fact that data was not completely deleted from the region. For this reason, data in the other storage region would be judged to be correct in this case.

If the data in the data writing region 2 is judged to be correct according to this method, the following two situations are conceivable: (1) updated data is written; and (2) a power failure occurred while writing updated data in the data saving region 3, so that pre-update data remains in the data writing region 2. If the situation in (2) is applicable, the operation of the device, such as a card reader, that has the nonvolatile memory 1 mounted is secure, although not with the updated data. As a result, abnormal operations of devices such as card readers can be avoided.

Although the embodiment described above is one example of preferred embodiments of the present invention, the present invention is not limited to this example and many modifications can be made without departing from the present invention. For example, the data error detection region 5 according to the present embodiment is provided at the center of addresses within each block of the storage regions 2 and 3 in order to find the CRC values for half of the data in each block, but other arrangements are also possible. By changing the calculation range of the CRC, the balance between the accuracy in discriminating data validity and the CRC calculation time when the power is turned on can be adjusted. In other words, while widening the calculation range of CRC would yield higher accuracy in discriminating data validity, the calculation time would be longer. On the other hand, a narrower CRC calculation range would reduce the accuracy in discriminating data validity, but the calculation time would be shorter.

If the end flag is written in the end flag region 4 when writing data in the nonvolatile memory 1 is completed and the CRC is not calculated, the configuration would be the simplest possible and the processing fast. However, this would have low discrimination of data validity when the power is turned on. Even if the end flag is "1," for example, in this case, it is possible that the end flag happens to be "1" due to the fact that a power failure occurred while data was being deleted from the applicable region and the data deletion was not completed.

On the other hand, if the CRC value is calculated for all data in the block and written in the nonvolatile memory 1 as a part of the block data, and the end flags are not used, although this would be effective for discrimination of data validity when the power is turned on, the CRC calculations would be time-consuming; consequently, the pre-processing to write data in the nonvolatile memory 1 would be a time-consuming process and render this method ineffective.

According to the present invention, these two types of methods (i.e., calculation of CRC values and use of end flags) are incorporated to take advantage of their strengths while compensating for their weaknesses. In other words, by reducing the amount of data applicable to CRC calculations and using the end flags, high-speed processing and discrimination of data validity call coexist.

A flash memory is used as the nonvolatile memory 1 in the present embodiment, but the nonvolatile memory 1 is not limited to this and EEPROM (electrically erasable programmable rend only memory) or FRAM (ferroelectric random access memory), which are rewritable, may be used as the nonvolatile memory 1.

Further in the present embodiment, CRC is used as the BCC in each block of both the data writing region 2 and the data saving region 3, but other methods may also be used.

As the above description makes clear, in accordance with the present invention, due to the fact that there are two storage regions within a nonvolatile memory and data remains in at least one of them at all times, even if data in one of the storage regions or a RAM were to be erased due to a power failure while data is being deleted from the storage region, the data still remains in the other storage region. As a result, next time the power is turned on, the data in the other storage region can be used to operate the applicable device. Consequently, the worst-case scenario, in which important data becomes irretrievably lost and the device operates abnormally, can be avoided.

Depending on the timing of power failure, data may exist in both the data writing region and the data saving region. In such a case, the data error detection region and the end flag region of both storage regions are checked and the validity of data in each storage region is judged. In this way, both the accuracy in discriminating data validity and shortening the judging time when the power is turned on after a power failure can be obtained.

Furthermore, due to the fact that the card reader according to the present invention is equipped with the nonvolatile memory, even if a circuit to detect power shut down or a backup power source is not provided in the card reader or an ATM device in which the card reader is installed, the card reader can be operated by using data in one of the two storage regions of the nonvolatile memory. As a result, the worst case scenario, in which important data is irretrievably lost and the card reader operates abnormally, can be avoided.

While the description above refers to particular embodiments of the present invention, it will be understood that many modifications may be made without departing from the spirit thereof. The accompanying claims are intended to cover such modifications as would fall within the true scope and spirit of the present invention.

The presently disclosed embodiments are therefore to be considered in all respects as illustrative and not restrictive, the scope of the invention being indicated by the appended claims, rather than the foregoing description, and all changes which come within the meaning and range of equivalency of the claims are therefore intended to be embraced therein.

What is claimed is:

1. A nonvolatile memory comprising:
    a data writing region to store necessary data; and
    a data saving region to temporarily store data when rewriting data, wherein each of the data writing region and the data saving region has an end flag region to indicate a completion of data writing, and a data error detection region in a center area thereof.

2. A method for updating data in a nonvolatile memory, the method comprising the steps of:
    writing in a RAM data stored in a data writing region of the nonvolatile memory;
    updating the data in the RAM;
    updating a data error detection region in the RAM based on the data updated;
    writing in a data saving region of the nonvolatile memory the data updated in the RAM;
    updating an end flag region of the data saving region;
    deleting the data from the data writing region; writing in the data writing region the data in the RAM;
    updating an end flag region of the data writing region; and
    deleting the data from the data saving region.

3. A method for updating data in a nonvolatile memory according to claim 2, wherein the data updated in the RAM remains in at least one of the data writing region and the data saving region in the nonvolatile memory.

4. A method for updating data in a nonvolatile memory according to claim 2, wherein the data updated in the RAM directly written from the RAM to the data saving region of the nonvolatile memory.

5. A method for updating data in a nonvolatile memory according to claim 2, wherein the data updated in the RAM and stored in the data saving region in the nonvolatile memory is written in the data writing region of the nonvolatile memory instead of writing in the data updated in the RAM directly from the RAM to the data saving region of the nonvolatile memory.

6. A method for updating data in a nonvolatile memory according to claim 2, wherein old data remains in the data writing region in the nonvolatile memory until the data updated in the RAM is written in the data saving region of the nonvolatile memory.

7. A method for updating data in a nonvolatile memory according to claim 2, wherein old data in the data writing region in the nonvolatile memory is erased after the data updated in the RAM is written in the data saving region of the nonvolatile memory.

8. A method for updating data in a nonvolatile memory according to claim 7, wherein, after the old data in the data writing region in the nonvolatile memory is erased, at least one of the data saving region and the data writing region stores the data updated in the RAM.

9. A method for updating data in a nonvolatile memory according to claim 7, wherein, after the old data in the data writing region in the nonvolatile memory is erased, both of the data saving region and the data writing region store the data updated in the RAM.

10. A method for updating data in a nonvolatile memory according to claim 2, further comprising the steps of referring to the data error detection region and the end flag region in at least one of the data writing region and the data saving region upon starting an operation of the nonvolatile memory; and determining if at least one of the data stored in the data writing region and the data saving region is valid.

11. A method for updating data in a nonvolatile memory according to claim 2, wherein, when the data in the data saving region is judged to be valid, the data is written in the data writing region.

12. A method for updating data in a nonvolatile memory according to claim 2, wherein, when the data in the data writing region is judged to be valid, the data remains in the data writing region but the data in the data saving region is deleted.

13. A card reader device comprising a nonvolatile memory, the nonvolatile memory comprising:
a data writing region to store necessary data; and
a data saving region to temporarily store data when rewriting data, wherein each of the data writing region and the data saving region has an end flag region to indicate a completion of data writing, and a data error detection region in a center area thereof.

14. A method for updating data in a nonvolatile memory of a card reader device, the method comprising the steps of:
writing in a RAM data stored in a data writing region of the nonvolatile memory;
updating the data in the RAM;
updating a data error detection region in the RAM based on the data updated;
writing in a data saving region of the nonvolatile memory the data updated in the RAM;
updating an end flag region of the data saving region;
deleting the data from the data writing region; writing in the data writing region the data in the RAM;
updating an end flag region of the data writing region; and
deleting the data from the data saving region.

15. A method for updating data in a nonvolatile memory of a card reader device according to claim 14, wherein the data updated in the RAM remains in at least one of the data writing region and the data saving region in the nonvolatile memory.

16. A method for updating data in a nonvolatile memory of a card reader device according to claim 14, wherein the data updated in the RAM directly written from the RAM to the data saving region of the nonvolatile memory.

17. A method for updating data in a nonvolatile memory of a card reader device according to claim 14, wherein the data updated in the RAM and stored in the data saving region in the nonvolatile memory is written in the data writing region of the nonvolatile memory instead of writing in the data updated in the RAM directly from the RAM to the data saving region of the nonvolatile memory.

18. A method for updating data in a nonvolatile memory of a card reader device according to claim 14, wherein old data remains in the data writing region in the nonvolatile memory until the data updated in the RAM is written in the data saving region of the nonvolatile memory.

19. A method for updating data in a nonvolatile memory of a card reader device according to claim 14, wherein old data in the data writing region in the nonvolatile memory is erased after the data updated in the RAM is written in the data saving region of the nonvolatile memory.

20. A method for updating data in a nonvolatile memory of a card reader device according to claim 19, wherein, after the old data in the data writing region in the nonvolatile memory is erased, at least one of the data saving region and the data writing region stores the data updated in the RAM.

21. A method for updating data in a nonvolatile memory of a card reader device according to claim 19, wherein, after the old data in the data writing region in the nonvolatile memory is erased, both of the data saving region and the data writing region store the data updated in the RAM.

22. A method for updating data in a nonvolatile memory of a card reader device according to claim 14, further comprising the steps of referring to the data error detection region and the end flag region in at least one of the data writing region and the data saving region upon starting an operation of the nonvolatile memory; and determining if at least one of the data stored in the data writing region and the data saving region is valid.

23. A method for updating data in a nonvolatile memory of a card reader device according to claim 14, wherein, when the data in the data saving region is judged to be valid, the data is written in the data writing region.

24. A method for updating data in a nonvolatile memory of a card reader device according to claim 14, wherein, when the data in the data writing region is judged to be valid, the data remains in the data writing region but the data in the data saving region is deleted.

* * * * *